(12) United States Patent
Benisty et al.

(10) Patent No.: US 11,487,544 B2
(45) Date of Patent: Nov. 1, 2022

(54) METHOD AND DEVICE FOR SIMULTANEOUSLY DECODING DATA IN PARALLEL TO IMPROVE QUALITY OF SERVICE

(71) Applicant: Western Digital Technologies, Inc., San Jose, CA (US)

(72) Inventors: Shay Benisty, Beer Sheva (IL); Eran Banani, Meitar (IL); Yuri Ryabinin, Beer Sheva (IL)

(73) Assignee: Western Digital Technologies, Inc., San Jose, CA (US)

( * ) Notice: Subject to any disclaimer, the term of this patent is extended or adjusted under 35 U.S.C. 154(b) by 380 days.

(21) Appl. No.: 16/744,059

(22) Filed: Jan. 15, 2020

(65) Prior Publication Data
US 2021/0216326 A1  Jul. 15, 2021

(51) Int. Cl.
| G06F 9/00 | (2006.01) |
| G06F 9/38 | (2018.01) |
| G06F 12/02 | (2006.01) |
| G06F 9/54 | (2006.01) |
| G06F 9/30 | (2018.01) |

(52) U.S. Cl.
CPC ........ *G06F 9/3822* (2013.01); *G06F 9/30196* (2013.01); *G06F 9/3836* (2013.01); *G06F 9/546* (2013.01); *G06F 12/0246* (2013.01)

(58) Field of Classification Search
None
See application file for complete search history.

(56) References Cited

U.S. PATENT DOCUMENTS

| 8,595,415 B2 | 11/2013 | Van Aken et al. |
| 10,135,465 B2 | 11/2018 | Parthasarathy et al. |
| 10,171,110 B1 | 1/2019 | Pream et al. |
| 10,218,384 B2 | 2/2019 | Sharon et al. |
| 10,931,400 B2 * | 2/2021 | Jang ...................... H03M 13/13 |
| 2009/0125538 A1 * | 5/2009 | Rosenzweig ........ H04N 19/436 |

(Continued)

FOREIGN PATENT DOCUMENTS

KR  20170078953 A  7/2017

OTHER PUBLICATIONS

S. Seo et al., "Design and implementation of a mobile storage leveraging the DRAM interface," 2016 IEEE International Symposium on High Performance Computer Architecture (HPCA), 2016, pp. 531-542, doi: 10.1109/HPCA.2016.7446092. (Year: 2016).*

*Primary Examiner* — Daniel F. McMahon
(74) *Attorney, Agent, or Firm* — Patterson & Sheridan, LLP; Steven H. VerSteeg (57) ABSTRACT

The present disclosure generally relates to a method and device for simultaneously decoding data. Rather than sending data to be decoded to a single decoder, the data can be sent to multiple, available decoders so that the data can be decode in parallel. The data decoded from the first decoder that completes decoding of the data will be delivered to the host device. All remaining decoded data that was decoded in parallel will be discarded. The decoders operating simultaneously in parallel can operate using different parameters such as different calculation precision (power levels). By utilizing multiple decoders simultaneously in parallel, the full functionality of the data storage device's decoding capabilities are utilized without increasing latency.

20 Claims, 4 Drawing Sheets

(56) References Cited

U.S. PATENT DOCUMENTS

| | | | |
|---|---|---|---|
| 2015/0169406 A1* | 6/2015 | Li | G06F 11/1012 |
| | | | 714/763 |
| 2017/0269991 A1* | 9/2017 | Bazarsky | G06F 3/064 |
| 2017/0331500 A1 | 11/2017 | Bhatia et al. | |
| 2018/0191381 A1* | 7/2018 | Achtenberg | H03M 13/3707 |
| 2021/0223987 A1* | 7/2021 | Zhang | H03M 13/616 |

\* cited by examiner

METHOD AND DEVICE FOR SIMULTANEOUSLY DECODING DATA IN PARALLEL TO IMPROVE QUALITY OF SERVICE

BACKGROUND OF THE DISCLOSURE

Field of the Disclosure

Embodiments of the present disclosure generally relate to a method and device for simultaneously decoding data.

Description of the Related Art

The enterprise SSD market has different requirements, especially in terms of quality of service (QoS). QoS is extremely important in enterprise SSDs and therefore strict requirements are defined.

One example of those requirements is the latency of the I/O commands. In client SSDs, there are no strict requirements in latency, but rather, only in performance. Enterprise solutions are ranked based on their QoS and is measured in the "nines" technique. The table below illustrates one example of this classification.

TABLE

|  | 4 kb(µs) | 8 kb(µs) | 64 kb(µs) | Operations needed |
|---|---|---|---|---|
| Average | 240 | 250 | 450 | — |
| 99% (2 9's) | 300 | 360 | 770 | >100 |
| 99.9% (3 9's) | 400 | 380 | 1,000 | >1,000 |
| 99.99% (4 9's) | 500 | 550 | 3,000 | >10,000 |
| 99.999% (5 9's) | 1,000 | 2000 | 3,500 | >1e5 |
| 99.9999% (6 9's) | 3,000 | 4000 | 5,000 | >1e6 |
| 99.99999% (7 9's) | 5,000 | 6,000 | 8,000 | >1e7 |
| 99.999999% (8 9's) | 7,000 | 8,000 | 10,000 | >1e8 |
| Maximum timeout | 11,000 | 12,000 | 20,000 | — |

A device that is classified as "2 nines", should complete 99% of 4 KB read commands in less than 300 uSec. A device that is classified as "3 nines" should support the "2 nines" requirement and 99.9% of the 4 KB read command should be completed within 400 uSec and so on.

The QoS results depend on the workload and therefore the requirements are based on the specific workload. The table above refers to a queue depth of one (i.e., only a single command is executed by the storage device at a time). Different requirements might be set for other queue depths (e.g., low and high queue depths).

Therefore, there is a need in the art for improving the QoS results in low queue depth scenarios using the already existing resources implemented in the storage device which are not usually used in low queue depth scenarios.

SUMMARY OF THE DISCLOSURE

The present disclosure generally relates to a method and device for simultaneously decoding data. Rather than sending data to be decoded to a single decoder, the data can be sent to multiple, available decoders so that the data can be decoded in parallel. The data decoded from the first decoder that completes decoding of the data will be delivered to the host device. All remaining decoded data that was decoded in parallel will be discarded. The decoders operating simultaneously in parallel can operate using different parameters such as different power levels. By utilizing multiple decoders simultaneously in parallel, the full functionality of the data storage device's decoding capabilities are utilized without increasing latency. As a result, quality of service (QoS) is improved.

In one embodiment, a data storage device comprises: a plurality of nonvolatile memory devices; a plurality of decoders, wherein the plurality of decoders in number is equal to the plurality of memory devices; a scheduler coupled to the plurality of decoders; and a controller coupled to the plurality of nonvolatile memory devices, the scheduler, and the plurality of decoders, wherein the controller is configured to do the following when operating in low queue depth mode: receive a read request from a host device to retrieve data from the plurality of nonvolatile memory devices; retrieve the data from at least one nonvolatile memory device of the plurality of nonvolatile memory devices; decode the data in at least two decoders of the plurality of decoders; and deliver the decoded data to the host device.

In another embodiment, a data storage device comprises: at least one nonvolatile memory device; a pool of decoders comprising a plurality of decoders, wherein each decoder of the plurality of decoders operates at a different calculation precision (power level) and/or each different configuration; a scheduler coupled to the pool of decoders, wherein the scheduler is configured to direct data to the pool of decoders; and a controller coupled to the at least one nonvolatile memory device, the pool of decoders, and the scheduler, wherein the controller is configured to do the following when operating in either high queue depth mode or low queue depth mode: receive a read request from a host device to retrieve data from the at least one nonvolatile memory device; retrieve the data from at least one nonvolatile memory device; decode the data in at least two decoders of the pool of decoders; and deliver the decoded data to the host device.

In another embodiment, a data storage device comprises: at least one nonvolatile memory device; means to decode the same data multiple times simultaneously, wherein the means to decode is coupled to the at least one nonvolatile memory device; and means to deliver decoded data to a host device, wherein the means to deliver is coupled to the means to decode.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a method and device for simultaneously decoding data. Rather than sending data to be decoded to a single decoder, the data can be sent to multiple, available decoders so that the data can be decoded in parallel. The data decoded from the first decoder that completes decoding of the data will be delivered to the host device. All remaining decoded data that was decoded in parallel will be discarded. The decoders operating simultaneously in parallel can operate using different parameters such as different calculation precision (power levels). By utilizing multiple decoders simultaneously in parallel, the full functionality of the data storage device's decoding capabilities are utilized without increasing latency. As a result, quality of service (QoS) is improved.

The present disclosure describes a method for improving the QoS results in low queue depth scenarios using the already existing error correction code (ECC) resources implemented in the storage device which are not usually used in low queue depth scenarios. The main approach is to activate several ECC decoders in the storage device to work on the same 4 KB task. Each decoder is initialized differently, which may lead to different results. The populated decoders then compete with each other, and the first read corrected data will be posted to the host device immediately. The corrected data from other engines is discarded. The approach will save several micro-seconds in latency and lead to better QoS results in low queue depth.

In the device controller of a data storage device, the only hardware engine that may introduce non-deterministic delay is the error correction engine. The error correction engine has non-deterministic delay since low density parity check (LDPC) is a statistical algorithm and different initial configurations of the engine may have an impact on the latency. In an LDPC based system, several internal engines may be present, according to the bit error rate (BER) that the engines can correct, their calculation precision and the power the engines consume to do that. Example error correction engines include: ULP (Ultra Low Power), LP (Low Power) and FP (Full Power).

Figure 1:
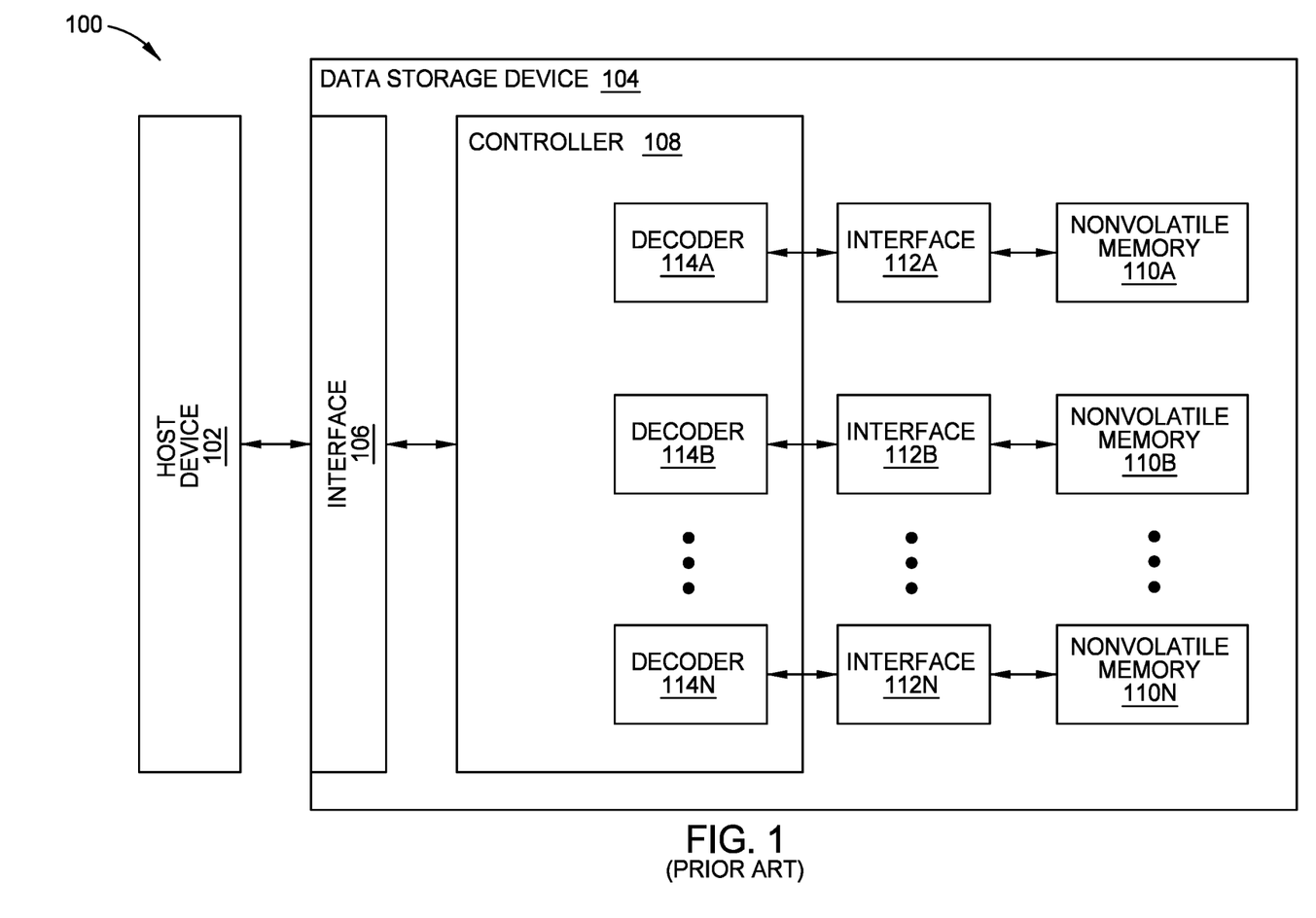
FIG. 1 is a schematic illustration of a system for decoding data according to the prior art.

FIG. 1 is a schematic illustration of a system 100 for decoding data. The system 100 includes a host device 102 that is coupled to a data storage device 104 through an interface 106. The data storage device 104 includes a plurality of nonvolatile memory devices 110A-110N that each have a corresponding interface 112A-112N that coupled to a controller 108 that is coupled to the interface 106. The controller 108 includes a plurality of decoders 114A-114N. The number of decoders 114A-114N is equal to the number of memory device interfaces 112A-112N. Similarly, the number of memory device interfaces 112A-112N is equal to the number of nonvolatile memory devices 110A-110N. Stated another way, each memory device 110A-110N has both a corresponding interface 112A-112N and a corresponding decoder 114A-114N.

In operation, when the host device 102 request data to be read from the data storage device 104, the data is retrieved from the specific memory device 110A-110N, decoded, and delivered to the host device 102. For example, if the data is in memory device 110B, then the data passes through interface 112B, which is coupled to the memory device 110B. The data is then delivered to the decoder 114B that is coupled to the interface 112B. In other words, the data that is in a specific memory device 110A-110N will pass through an interface 112A-112N dedicated to the specific memory device 110A-110N and then is decoded in a specific decoder 114A-114N that is dedicated to a specific interface 112A-112N and specific memory device 110A-110N. Thus, if the data is retrieved from memory device 110B for example, only interface 112B that is coupled to memory device 110B is used. Similarly, only decoder 114B that is coupled to interface 112B is used. All other decoders 114A, 114C-114N remain idle, unless of course data is being decoded from a corresponding memory device 110A, 110C-110N.

The system 100 shown in FIG. 1 has a dedicated decoder 114A-114N for each memory device 110A-110N. Any data that needs decoded for a specific memory device 110A-110N is only decoded in the specific decoder 114A-114N that is dedicated to the specific memory device 110A-110N. One can imagine a scenario where one memory device 110A-110N sends data to be decoded to the dedicated decoder 114A-114N for the specific memory device 110A-110N. In that scenario, only the single, dedicated decoder 114A-114N will operate to decode the data while the remaining decoders 114A-114N remain idle (assuming the remaining memory devices 110A-110N have not sent any data to be decoded to their respective dedicated decoders 114A-114N. It would be beneficial to utilize otherwise idle decoders 114A-114N. As discussed herein, the disclosure describes activating several LDPC decoders for a single 4 KB of data. Each LDPC decoder is initialized with different parameters as detailed below. The LDPC decoding engines that work on the same 4 KB of data are in competition, and the first decoding engine that has a successful result will be the winner. The decoded data will be transferred to the host device 102. Using this method, dozens of microseconds in latency can be reduced which will lead to better QoS results. The system 100 of FIG. 1 is not capable of utilizing the otherwise idle decoders 114A-114N. Hence, other systems, as will be described below, have been developed to take advantage of idle decoders to improve the decoding QoS.

Figure 2:
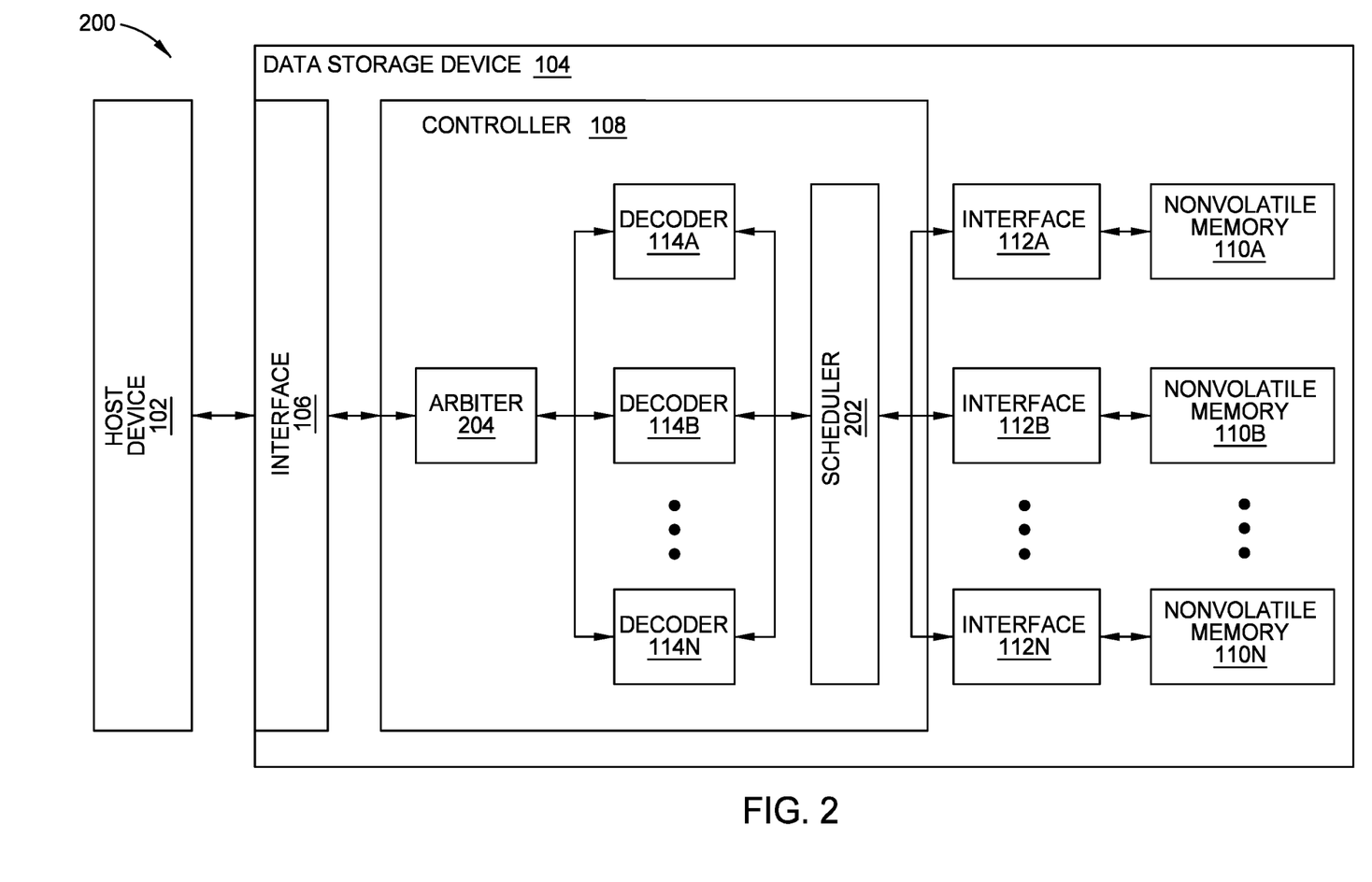
FIG. 2 is a schematic illustration of a system for decoding data according to one embodiment.

FIG. 2 is a schematic illustration of a system 200 for decoding data according to one embodiment. The system 200 in FIG. 2 is quite similar to the system 100 in FIG. 1 with the exception of the presence of a scheduler 202. In fact, during high queue depth operation, system 200 will operate very similar to system 100 in that each memory device 110A-110N will have a corresponding decoder 114A-114N. More specifically, each memory device during high queue depth operation will always send data to be decoded through the same decoder 114A-114N each time data needs to be decoded. The real advantage of system 200 occurs during low queue depth operations where several decoders 114A-114N may be used to decode the same data. Note that in system 200, each memory device 110A-110N still has a dedicated decoder 114A-114N and will always send data to be decoded to the specific decoder 114A-114N dedicated thereto, regardless of whether operating in low queue depth (i.e., less than all deciders 114A-114N in use decoding different data) or high queue depth (i.e., all decoders 114A-114N in use decoding different data). However, in low queue depth operation, the data to be decoded will be sent by the scheduler 202 not only to the dedicated decoder 114A-114N, but also to at least one other decoder 114A-114N that is dedicated to a different memory device 110A-110N.

As shown in FIG. 2, prior to heading to the dedicated decoder 114A-114N, the data passes through a scheduler 202. All of the data, regardless of which memory device 110A-110N and interface 112A-112N through which the data passes will be organized by a scheduler 202. The scheduler 202 will ensure that the data is decoded not only in the dedicated decoder 114A-114N, but in other, available (i.e., not in use) decoders 114A-114N.

The LDPC decoder scheduler 202 activates multiple LDPC decoders 114A-114N to work on the same task and have a competition. For example, a single 4 KB transfer activates all LDPC decoders 114A-114N implemented in the data storage device 104 controller 108. Those operations are controlled by the LDPC decoder scheduler 202. The corrected data that is first ready will be transmitted to the host device 102 while ignoring the results of the other LDPC decoders. An arbiter 204 will receive the decoded data and send the first decoded data along while discarding the remaining decoded data.

Figure 3:
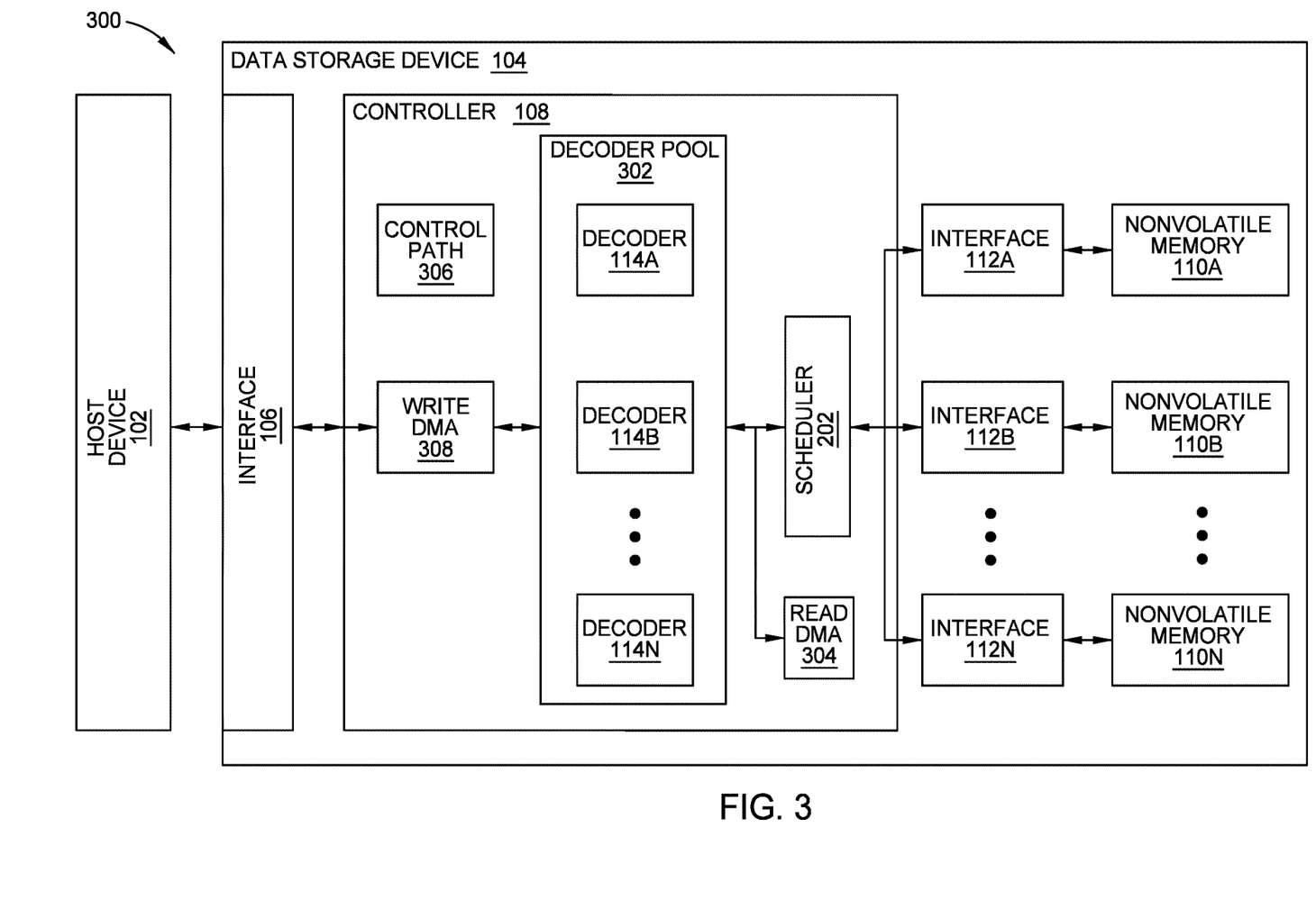
FIG. 3 is a schematic illustration of a system for decoding data according to another embodiment.

FIG. 3 is a schematic illustration of a system 300 for decoding data according to another embodiment. In FIG. 3, the device controller 108 has a decoder pool 302 shared by all memory devices 110A-110N rather than dedicated decoders for each memory device (e.g. NAND). In the system 300 of FIG. 3, regardless of whether operating in high queue depth or low queue depth, any decoder 114A-114N in the decoder pool 302 can execute any task that is associated with any memory device 110A-110N. In low queue depth operation, the same data will be decoded in multiple decoders 114A-114N from the decoder pool 302. Stated another way, there is no specific dedicated decoder 114A-114N for each memory device 110A-110N in system 300, though the number of decoders 114A-114N may equal the number of memory devices 110A-110N. The decoder pool 302 will function similar to the system 200 in FIG. 2 except that rather than the scheduler 202 sending the data to a dedicated decoder 114A-114N as well as other available decoders 114A-114N, the scheduler sends the data to all available decoders 114A-114N in the decoder pool 302. In other words, the difference between system 200 and 300 is system 200 has dedicated decoders 114A-114N while system 300 has a decoder pool 302. In system 300, the number of decoders does not have to equal the number of memory devices 110A-110N or the number of interfaces 112A-112N. Rather, the number of memory devices 100A-110N in system 300 may be different than the number of decoders 114A-114N. The system also includes a control path 306, a read direct memory access (DMA) 304 for the discarded decoded data, and a write DMA 308 for the decoded data. The write DMA 308 sends the decoded data through the interface 106 to the host device 102. The read DMA 304 discards the decoded data that is not needed. The control path 306 ensures the data moves through the controller along the correct path to/from the memory device 110A-110N.

The decoders 114A-114N may each be different. For example, one or more decoders 114A-114N may be a ULP decoder, one or more decoders 114A-114N may be a LP decoder 114A-114N, and one or more decoders 114A-114N may be a FP decoder 114A-114N. Additionally, each decoder 114A-114N may operate according to different parameters regardless of whether the decoder 114A-114N is a ULP, LP, or FP decoder. For example, two different ULP decoders 114A-114N may have different parameters, two different LP decoders 114A-114N may have different parameters, and two different FP decoders 114A-114N may have different parameters. Furthermore, ULP, LP, and FP decoders 114A-114N may have different parameters other than power level. Alternatively, ULP, LP, and FP decoders 114A-114N may have the same parameters, but different power levels.

Examples of initialization parameters that may be configured differently in different decoders 114A-114N to influence the decoding dynamic and decoding time include: power modes in which the decoder 114A-114N starts including ULP, LP, FP; enable "R-messages clipping" in decoders 114A-114N working in LP and FP modes; initial log likelihood ratio (LLR) tables for LP and FP modes; maximum number of iterations before and after clipping in LP and FP modes; mismatch decoding (MMD) settings in FP mode such as maximum number of iterations and "update frequency"; soft bit number (e.g., no soft bits, one soft bit, two soft bits); bit-flipping decision thresholds; and syndrome weight threshold for bit-flipping decision thresholds adjustment (e.g., threshold drop) in ULP decoders 114A-114N.

For example, a first LDPC decoder is set to start in ULP mode with first set of bit flipping decision thresholds, a second LDPC decoder is set to start in ULP mode with second set of bit flipping decision thresholds, a third LDPC decoder is set to start in LP mode, and a fourth LDPC decoder is set to start in FP mode. Of course, if there are "N" decoders there can be "N" different configurations. In the example, if all four decoders are available when the read data arrives at the scheduler, the data is sent to all four decoders. Whichever decoder of the four decoders completes the decoding operation first is the winner, and the data from the winning decoder is delivered to the host device. The decoded data from the other three decoders is then discarded.

It is important to note that sometimes data is decoded by first attempting to decode the data in a ULP decoder. If the ULP decoder fails, then the data is decoded in a LP decoder. If the LP decoder fails, then the data is decoded in a FP decoder. Stated another way, the data is decoded serially (i.e., ULP decoder, then LP decoder if necessary, then FP decoder if necessary). Typically a ULP decoder is faster than a LP decoder. Additionally, a LP decoder is typically faster than a FP decoder.

Imagine a scenario where ULP decoding takes a time period of 1× (regardless of whether the decoding is successful or not), LP decoding takes a time period of 2× (regardless of whether the decoding is successful or not), and FP decoding takes a time period of 3× (regardless of whether the decoding is successful or not). In the simple, serial example, there are three possibilities in which the data is first sent to a ULP decoder. If the data is successfully decoded in the ULP decoder, the data is decoded in a time period of 1×. If the data is not successfully decoded in the ULP decoder, but is then successfully decoded in the LP decoder, the data is decoded in a time period of 3× (i.e., 1×+2×). If the data is not successfully decoded in the ULP decoder and the LP decoder, but is successfully decoded in the FP decoder, the data is decoded in a time period of 6× (i.e., 1×+2×+3×).

Now take the same data and decode the data according to the embodiments disclosed herein. Rather than sending data to the ULP decoder, then the LP decoder, and finally the FP decoder, the data is sent to the ULP decoder, LP decoder, and FP decoder in parallel. Thus, if the ULP decoder is able to successfully decode the data, then the data is decoded in a time period of 1×, which is the same time period as would occur in the serial example where the ULP decoder is successful. In that scenario, both the LP decoder and FP decoder are likely to be successful as well, but take a longer period of time and thus have their decoded data discarded. If the ULP is unsuccessful, but the LP decoder is successful, then the data is decoded in a time period of 2×, which is faster than the time period in the serial example (i.e., 3×). Presumably the FP decoder will be successful as well if the LP decoder is successful and thus the FP decoded data is discarded. If both the ULP decoder and LP decoder are unsuccessful, but the FP decoder is successful, then the data is decoded in a time period of 3×, which is faster than the serial example (i.e., 6×). Thus, in the situations where the ULP decoder is successful, the data is decoded in the same period of time regardless of whether the data is decoded serially or in parallel. However, in the event that the ULP decoder is unsuccessful, then the parallel decoding described herein will be much faster and thus deliver a higher QoS to the host device.

Figure 4:
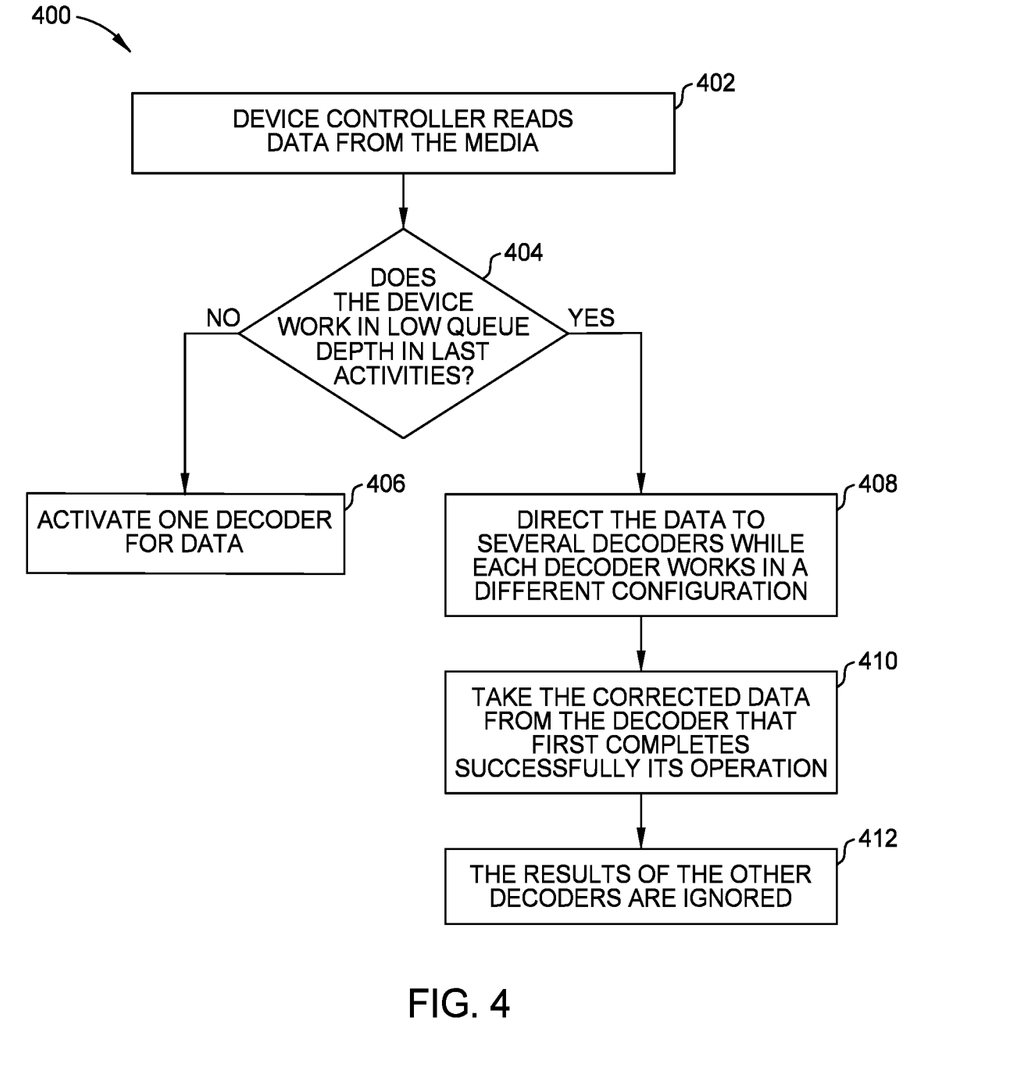
FIG. 4 is a flowchart illustrating a method for decoding data according to one embodiment.

FIG. 4 is a flowchart 400 illustrating a method for decoding data according to one embodiment. When device controllers work in low queue depth mode for a long time, the read data from the memory device (e.g., NAND) is transferred to multiple LDPC decoders which work in parallel. The decoders are populated with different static and/or dynamic initialization parameters. The corrected data that is first ready will be transmitted to the host device while ignoring the results of the other LDPC decoders. The process begins at 402 where the device controller reads data from the media. Then, at 404, a determination is made regarding whether the device works in low queue depth with the last activities. If the answer in 404 is no, then only one decoder is activated for decoding the data in 406. If the answer in 404 is yes, however, then the data is directed to several decoders in 408 so that each decoder will work in a different configuration to decode the data. Then, the corrected data that is first obtained from a detector is chosen in 410 and delivered to the host device. The results of the other decoders are ignored in 412.

In one embodiment, a data storage device comprises: a plurality of nonvolatile memory devices; a plurality of decoders, wherein the plurality of decoders is equal in number to the plurality of nonvolatile memory devices; a scheduler coupled to the plurality of decoders; and a controller coupled to the plurality of nonvolatile memory devices, the scheduler, and the plurality of decoders, wherein the controller is configured to do the following when operating in low queue depth mode: receive a read request from a host device to retrieve data from the plurality of nonvolatile memory devices; retrieve the data from at least one nonvolatile memory device of the plurality of nonvolatile memory devices; decode the data in at least two decoders of the plurality of decoders; and deliver the decoded data to the host device. The controller is configured to determine whether the plurality of decoders operated in a low queue depth mode immediately prior to receiving the read request. The controller is configured to receive the decoded data from the at least two decoders. The controller is configured to deliver the data to the host device which was decoded first. The controller is configured to discard decoded data that was not decoded first. At least one decoder operates at a different calculation precision, power level, and/or different configuration than another decoder. The data storage device also comprises an arbiter coupled to the plurality of decoders. The data storage device also comprises a plurality of flash interface modules, wherein one flash interface module of the plurality of flash interface modules is disposed between one decoder of the plurality of decoders and a corresponding nonvolatile memory device of the plurality of nonvolatile memory devices.

In another embodiment, a data storage device comprises: at least one nonvolatile memory device; a pool of decoders comprising a plurality of decoders, wherein each decoder of the plurality of decoders operates at a different calculation precision, power level, and/or different configuration; a scheduler coupled to the pool of decoders, wherein the scheduler is configured to direct data to the pool of decoders; and a controller coupled to the at least one nonvolatile memory device, the pool of decoders, and the scheduler, wherein the controller is configured to do the following when operating in either high queue depth mode or low queue depth mode: receive a read request from a host device to retrieve data from the at least one nonvolatile memory device; retrieve the data from at least one nonvolatile memory device; decode the data in at least two decoders of the pool of decoders; and deliver the decoded data to the host device. The controller is configured to determine which decoders are available to receive a read request. The controller is configured to determine which of the available decoders operated in a low queue depth mode immediately prior to receiving the read request. At least one decoder operates in a low power mode and at least one decoder operates in a full power mode. The data storage device further comprises a single flash interface module coupled between the pool of decoders and the at least one nonvolatile memory device. At least two decoders operate in full power mode, and wherein the at least two decoders have different decoding settings. An initial LLR table is used by at least one decoder operating in lower power mode and by at least one decoder operating in full power mode. A maximum number of iterations before and after clipping is configured differently for two different decoders operating in lower power mode.

In another embodiment, a data storage device comprises: at least one nonvolatile memory device; means to decode the same data multiple times simultaneously, wherein the means to decode is coupled to the at least one nonvolatile memory device; and means to deliver decoded data to a host device, wherein the means to deliver is coupled to the means to decode. The data storage device further comprises means to schedule operation of the means to decode, wherein the means to schedule is coupled to the means to decode. A plurality of nonvolatile memory devices are coupled to a single means to decode. The data storage device further comprises an arbiter coupled to the means to deliver.

By sending data to be decoded through multiple decoders in parallel, it is likely that at least one decoder will be able to decode the data. The data decoded from whichever decoder decodes the data first will be delivered to the host device and the remaining decoders will be discarded. The QoS is increased because the parallelism will achieve the same results that would be achievable is processed serially, but much faster.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
a plurality of nonvolatile memory devices;
a plurality of decoders, wherein the plurality of decoders is equal in number to the plurality of nonvolatile memory devices;
a scheduler coupled to the plurality of decoders; and
a controller coupled to the plurality of nonvolatile memory devices, the scheduler, and the plurality of decoders, wherein the controller is configured to do the following when operating in low queue depth mode:
receive a read request from a host device to retrieve data from the plurality of nonvolatile memory devices;
retrieve the data from at least one nonvolatile memory device of the plurality of nonvolatile memory devices;
decode the data in parallel in at least two decoders of the plurality of decoders[H] wherein the at least two decoders have at least one different parameter; and
deliver the decoded data to the host device.

2. The data storage device of claim 1, wherein the controller is configured to determine whether the plurality of decoders operated in a low queue depth mode immediately prior to receiving the read request.

3. The data storage device of claim 1, wherein the controller is configured to receive the decoded data from the at least two decoders.

4. The data storage device of claim 3, wherein the controller is configured to deliver the decoded data to the host device from a first decoder of the at least two decoders which was decoded first.

5. The data storage device of claim 4, wherein the controller is configured to discard any decoded data from a decoder of the at least two decoders operating in parallel that did not finish decoding the data before the first decoder of the at least two decoders.

6. The data storage device of claim 1, wherein at least one decoder operates at a different calculation precision, power level, and/or different configuration than another decoder.

7. The data storage device of claim 1, further comprising an arbiter coupled to the plurality of decoders.

8. The data storage device of claim 1, further comprising a plurality of flash interface modules, wherein one flash interface module of the plurality of flash interface modules is disposed between one decoder of the plurality of decoders and a corresponding nonvolatile memory device of the plurality of nonvolatile memory devices.

9. A data storage device, comprising:
at least one nonvolatile memory device;
a pool of decoders comprising a plurality of decoders, wherein each decoder of the plurality of decoders operates at a different calculation precision, power level, and/or different configuration;
a scheduler coupled to the pool of decoders, wherein the scheduler is configured to direct read data from the at least one nonvolatile memory device to the pool of decoders; and
a controller coupled to the at least one nonvolatile memory device, the pool of decoders, and the scheduler, wherein the controller is configured to do the following when operating in either high queue depth mode or low queue depth mode:
receive a read request from a host device to retrieve read data from the at least one nonvolatile memory device;
retrieve the read data from at least one nonvolatile memory device;
decode the read data in at least two decoders operating in parallel of the pool of decoders, wherein the at least two decodes operate with at least one different parameter for decoding; and
deliver the decoded data to the host device.

10. The data storage device of claim 9, wherein the controller is configured to determine which decoders are available to receive the read data to decode.

11. The data storage device of claim 10, wherein the controller is configured to determine which of the available decoders operated in a low queue depth mode immediately prior to receiving the read request.

12. The data storage device of claim 9, wherein at least one decoder operates in a low power mode and at least one decoder operates in a full power mode.

13. The data storage device of claim 9, further comprising a single flash interface module coupled between the pool of decoders and the at least one nonvolatile memory device.

14. The data storage device of claim 9, wherein the at least two decoders operating in parallel of the pool of decoders operate in full power mode, and wherein the at least two decoders have different decoding settings.

15. The data storage device of claim 9, wherein an initial log likelihood ratio (LLR) table is used by at least one decoder operating in lower power mode and by at least one decoder operating in full power mode.

16. The data storage device of claim 9, wherein a maximum number of iterations for two different decoders operating in lower power mode is configured differently.

17. A data storage device, comprising:
at least one nonvolatile memory device;
means to decode the same data multiple times simultaneously with at least one different parameter for decoding in each instance, wherein the means to decode is coupled to the at least one nonvolatile memory device; and
means to deliver decoded data to a host device, wherein the means to deliver is coupled to the means to decode.

18. The data storage device of claim 17, further comprising means to schedule operation of the means to decode, wherein the means to schedule is coupled to the means to decode.

19. The data storage device of claim 17, wherein a plurality of nonvolatile memory devices are coupled to a single means to decode.

20. The data storage device of claim 17, further comprising an arbiter coupled to the means to deliver.

* * * * *